United States Patent
Ikeda

(10) Patent No.: US 11,378,728 B2
(45) Date of Patent: Jul. 5, 2022

(54) COATING PROCESSING APPARATUS, COATING PROCESSING METHOD, AND STORAGE MEDIUM

(71) Applicant: Tokyo Electron Limited, Tokyo (JP)

(72) Inventor: Fumihiko Ikeda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 448 days.

(21) Appl. No.: 16/313,524

(22) PCT Filed: Jun. 6, 2017

(86) PCT No.: PCT/JP2017/020963
§ 371 (c)(1),
(2) Date: Dec. 27, 2018

(87) PCT Pub. No.: WO2018/003426
PCT Pub. Date: Jan. 4, 2018

(65) Prior Publication Data
US 2020/0012025 A1    Jan. 9, 2020

(30) Foreign Application Priority Data

Jun. 30, 2016 (JP) .............................. JP2016-129710

(51) Int. Cl.
*B05C 5/02* (2006.01)
*G02B 5/30* (2006.01)

(52) U.S. Cl.
CPC .............. *G02B 5/3016* (2013.01); *B05C 5/02* (2013.01); *B05C 5/0254* (2013.01)

(58) Field of Classification Search
CPC .......... G02B 5/3016; G02B 1/11; G02B 1/10; H01L 51/0003; H01L 51/5281; C03C 17/002; C03C 2218/328; C03C 2218/112
See application file for complete search history.

(56) References Cited

U.S. PATENT DOCUMENTS

| | | | | |
|---|---|---|---|---|
| 5,460,653 | A | * | 10/1995 | Otani .................... B05B 13/041 118/668 |
| 5,814,368 | A | * | 9/1998 | Yamada .............. B05B 13/0468 427/180 |
| 10,850,507 | B2 | * | 12/2020 | Mine ........................ B41J 3/407 |

(Continued)

FOREIGN PATENT DOCUMENTS

| JP | 10-005677 A | 1/1998 |
|---|---|---|
| JP | 2005-062502 A | 3/2005 |

(Continued)

OTHER PUBLICATIONS

Machine translation of WO-2016051896 (Year: 2016).*
International Search Report dated Sep. 5, 2017 for WO 2018/003426 A1.

*Primary Examiner* — Charles Capozzi
(74) *Attorney, Agent, or Firm* — Venjuris, P.C.

(57) ABSTRACT

A coating processing apparatus that applies a coating liquid containing an optical material includes a substrate holder that holds a substrate, a coating nozzle that ejects the coating liquid to the substrate held by the substrate holder, and a moving mechanism that relatively moves the substrate holder and the coating nozzle in an orthogonal direction.

12 Claims, 17 Drawing Sheets

(56) References Cited

U.S. PATENT DOCUMENTS

2003/0134048 A1\* 7/2003 Shiotsuka ........... H01L 31/0203
427/74
2006/0096528 A1\* 5/2006 Kawatake ............ B05C 5/0262
118/407
2008/0254223 A1\* 10/2008 Goto .................... C03C 17/253
427/421.1

FOREIGN PATENT DOCUMENTS

| JP | 2008-180809 A | 8/2008 | |
|----|---------------|--------|---|
| JP | 2009-031627 A | 2/2009 | |
| JP | 2012-203205 A | 10/2012 | |
| WO | 2004/079413 A | 9/2004 | |
| WO | 2016/051896 A | 4/2016 | |
| WO | WO-2016051896 A1 \* | 4/2016 | ............... B05D 1/26 |

\* cited by examiner

COATING PROCESSING APPARATUS, COATING PROCESSING METHOD, AND STORAGE MEDIUM

CROSS REFERENCE TO RELATED APPLICATIONS

This application is a national phase of PCT application No. PCT/JP2017/020963, filed on Jun. 6, 2017, which claims priority from Japanese Patent Application No. 2016-129710 filed on Jun. 30, 2016 with the Japan Patent Office, all of which are incorporated herein by reference.

TECHNICAL FIELD

The present disclosure relates to a coating processing apparatus that applies a coating liquid containing an optical material to a substrate, a coating processing method using the coating processing apparatus, and a non-transitory computer-readable storage medium.

BACKGROUND

An organic light emitting diode (OLED) utilizes a circular polarizing plate for suppressing the reflection of external light. The circular polarizing plate is produced by laminating a linear polarizing plate and a wavelength plate (phase difference plate) such that polarizing axes thereof cross each other at 45 degrees. Further, a liquid crystal display (LCD) also utilizes the linear polarizing plate and wavelength plate in order to control the rotatory polarizing property or birefringence property in display.

Further, for example, in some cases, only the wavelength plate is formed such that the polarizing axis thereof is inclined at 15 degrees or 75 degrees. Therefore, it is required to form the polarizing plate or the wavelength plate at an arbitrary angle. In order to cross the polarizing axes of the polarizing plate or the wavelength plate at an arbitrary angle, it is also required to individually form these polarizing plate or wavelength plate.

In the related art, the polarizing plate or the wavelength plate has been produced using, for example, a stretched film. The stretched film is obtained by stretching and sticking a film in one direction, so as to orient the molecules of the material in a single direction.

Meanwhile, in recent years, as the OLED or the LCD becomes thinner, the polarizing plate or the wavelength plate is also required to be thinner. However, when a stretched film is used as in the related art for producing the polarizing plate or the wavelength plate, there is a limit in reducing the film thickness of the stretched film itself, and thus, it is difficult to obtain a sufficiently thin film.

Therefore, thinning of the film has been promoted by applying a coating liquid containing predetermined materials to a substrate and forming a polarizing plate or a wavelength plate having a required film thickness. Specifically, for example, a coating liquid having liquid crystal property is applied to a substrate as a predetermined material, and the coating liquid is cast and oriented. A liquid crystal compound forms a supramolecular associated product, and when the coating liquid is made to flow while applying shear stress, the major axis direction of the supramolecular associated product is oriented to the flowing direction.

In order to be able to apply the coating liquid to the substrate in this manner, in the related art, various apparatuses have been proposed.

For example, Patent Document 1 discloses a polarizing film printing apparatus including a table configured to hold a substrate and a slot die configured to eject an ink liquid to the substrate. The table has a configuration in which a surface plate is fitted into a frame plate from which the surface plate is cut out, and thus, the height of the peripheral portion of the surface plate may be made the same height as the surface of the substrate that is fixed to the surface plate. The slot die extends so as to cover at least the surface plate. Then, the substrate is further fixed in a state where the surface plate is arranged in a printing direction, the surface plate is further rotated so that the substrate is inclined by a predetermined angle with respect to the printing direction, and after that, the slot die is moved in the printing direction to apply the ink liquid to the substrate.

Further, for example, Patent Document 2 discloses a coating apparatus in which a coating liquid is supplied to a coating head including a belt-shaped slit that is opened upward and extends in a horizontal direction, the coating liquid is ejected from the slit so as to form a bead, a substrate to be applied having a rectangular planar shape is relatively moved in an obliquely upward direction above the coating head substantially along one diagonal direction of the substrate to be coated, and the coating liquid is adhered from the bead formed between the coating head and the substrate to be coated to a coating surface of the substrate to be coated.

PRIOR ART DOCUMENT

Patent Document

Patent Document 1: Japanese Patent Laid-Open Publication No. 2005-62502
Patent Document 2: Japanese Patent Laid-Open Publication No. 10-005677

SUMMARY OF THE INVENTION

Problem to be Solved

However, when the polarizing film printing apparatus disclosed in Patent Document 1, since the slot die extends so as to cover at least the surface plate, when the ink liquid is applied to the substrate, the ink liquid is ejected to the substrate fixed to the surface plate and the ink liquid is also ejected and adhered to a frame plate around the surface plate. Therefore, it is required to clean the frame plate for every single sheet at every coating processing of the substrate, and it takes a longer time.

Further, in the polarizing film printing apparatus of Patent Document 1, although the surface plate to which the substrate is fixed is rotated, the rotation of the surface plate is to receive the substrate at a predetermined position (a position parallel to the printing direction), but not to control the coating direction. In other words, the coating direction of the ink liquid to the substrate is fixed, and the coating direction is not able to be freely controlled.

Further, when the coating apparatus disclosed in Patent Document 2 is used, the coating liquid is applied to the substrate using surface tension. In this case, since it is required to adjust coating conditions such as a ejection pressure of the coating liquid from the coating head depending on an area of the coating liquid adhered to the substrate, that is, depending on an angle at which the coating liquid is applied, the control thereof becomes complicated.

Here, the shear stress (shear rate) during application is a value obtained by dividing the coating speed by a distance (gap) between the substrate and the coating head. However, in the coating apparatus of Patent Document 2, since surface tension is used, there is a limit in increasing the coating speed of the coating liquid to the substrate. Therefore, there is a possibility that sufficient shear stress may not be obtained.

The present disclosure has been made in view of these circumstances. The present disclosure is to properly apply a coating liquid containing an optical material at an arbitrary angle to a substrate.

Means to Solve the Problems

In order to solve the above problems, in an aspect of the present disclosure, a coating processing apparatus that applies a coating liquid containing an optical material includes: a substrate holder that holds a substrate; a coating nozzle that ejects the coating liquid to the substrate held by the substrate holder; and a moving mechanism that relatively moves the substrate holder and the coating nozzle in an orthogonal direction.

According to an aspect of the present disclosure, since the substrate holder and the coating nozzle are relatively move in the orthogonal direction, a coating direction of the coating liquid applied to the substrate may be freely controlled by controlling the relative moving speed of the substrate holder and the coating nozzle. With such a simple configuration and simple control, the coating liquid may be applied to the substrate at an arbitrary angle. That is, it is not required to adjust coating conditions at each time when the angle of the coating direction is changed as in the related art. Further, the coating speed of the coating liquid to the substrate may be controlled by controlling the moving speed in this manner, and thus, sufficient shear stress may be secured. Furthermore, it is possible to suppress the coating liquid from adhering to the substrate holder, so that it is not required to clean the substrate holder for every single sheet as in the related art. Therefore, it is possible to apply the coating liquid to the substrate appropriately and efficiently.

An aspect of the present disclosure according to another view point is a coating processing method including: ejecting a coating liquid containing an optical material from a coating nozzle while relatively moving a substrate holder that holds a substrate and the coating nozzle in an orthogonal direction with respect to each other; and applying coating liquid to the substrate.

An aspect of the present disclosure according to another view point is a non-transitory computer-readable storage medium having stored therein a computer executable program that causes a computer to perform a coating processing method by the coating processing apparatus.

Effect of the Invention

According to the present disclosure, a coating liquid containing an optical material may be appropriately and efficiently applied to a substrate at an arbitrary angle.

DETAILED DESCRIPTION TO EXECUTE THE INVENTION

Hereinafter, exemplary embodiments of the present disclosure will be described with reference to the drawings. Further, the present disclosure is not limited to the following exemplary embodiments.

<1. Optical Film Forming Apparatus>

First, a configuration of an optical film forming apparatus according to an embodiment will be described. In the present embodiment, in a case of producing a circular polarizing plate used in an OLED, a case where a linear polarizing film (linear polarizing plate) and a λ/4 wavelength film (λ/4 wavelength plate) are formed on a glass substrate as optical films will be described as an example. On the glass substrate before forming the linear polarizing film and the λ/4 wavelength film thereon, for example, a plurality of organic films (not illustrated) or the like are laminated and formed.

The optical film forming apparatus includes a coating processing apparatus, a decompressive drying apparatus, a heating processing apparatus, a film fixing apparatus, and a film removing apparatus. Hereinafter, configurations of these apparatuses will be described. In drawings illustrated below, in order to clarify positional relationships, the X-axis direction, the Y-axis direction, and the Z-axis direction which are orthogonal to each other will be defined. The positive Z-axis direction will be regarded as a vertically upward direction.

<1-1. Coating Processing Apparatus>

Figure 1:
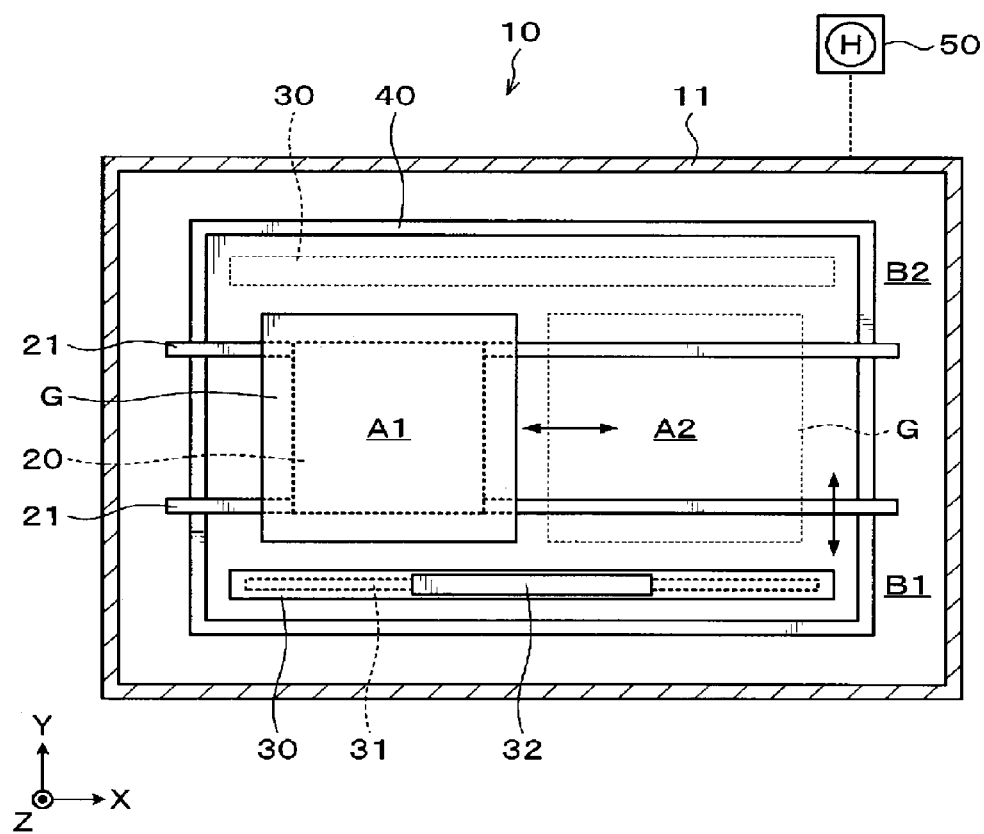
FIG. 1 is a cross-sectional view illustrating a schematic configuration of a coating processing apparatus according to an embodiment.
Figure 2:
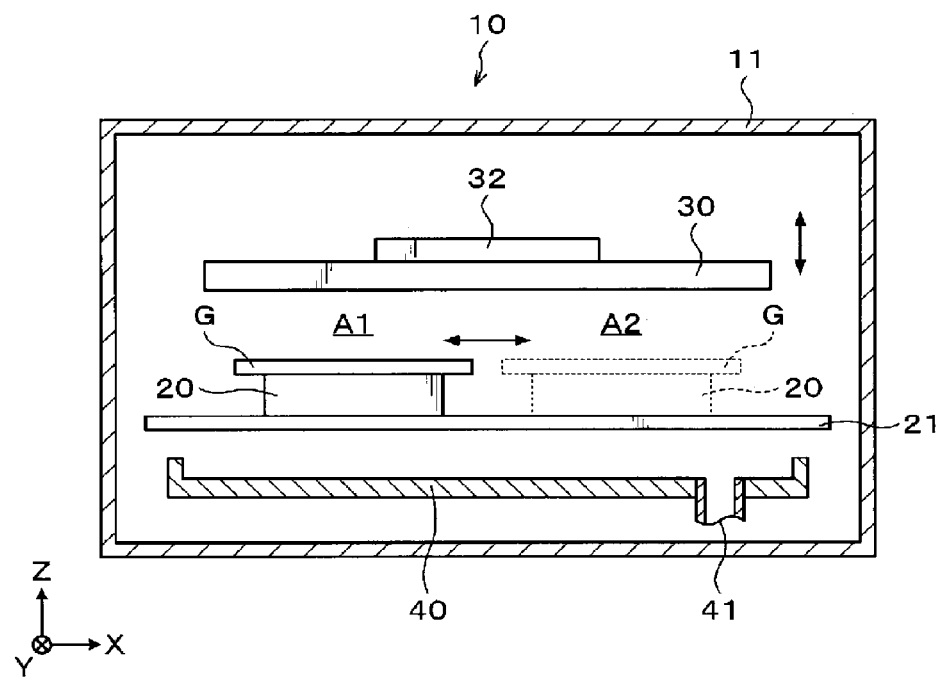
FIG. 2 is a vertical-sectional view illustrating a schematic configuration of the coating processing apparatus according to the present embodiment.

FIG. 1 is a cross-sectional view illustrating a schematic configuration of a coating processing apparatus. FIG. 2 is a vertical-sectional view illustrating a schematic configuration of the coating processing apparatus. In the coating processing apparatus 10, a coating liquid is applied to an entire surface of a glass substrate G.

The coating processing apparatus 10 includes a processing container 11. A carry-in/out port (not illustrated) for the glass substrate G is formed on a side surface of the processing container 11, and an open/close shutter (not illustrated) is provided at the carry-in/out port.

A stage 20 is provided as a holding unit inside the processing container 11 to hold the glass substrate G The stage 20 absorbs and holds a back surface of the glass substrate G such that a surface thereof to which the coating liquid is applied faces upward. Further, the stage 20 has a smaller shape than the glass substrate G in a plan view.

The stage 20 is adhered to a pair of rails 21 and 21 which are provided on a lower surface side of the stage 20 and extend in the X-axis direction. Then, the stage 20 is configured to be movable along the rails 21. Further, the rails 21 extend in the X-axis direction at least longer than a length of the two glass substrates G Therefore, the glass substrate G (indicated by a solid line in the drawing, substrate position A1) in a case where the stage 20 is positioned at an end portion in a negative direction of the X-axis direction and the glass substrate G (indicated by a dotted line in the drawing, substrate position A2) in a case where the stage 20 is positioned at an end portion in a positive direction of the X-axis direction do not overlap with each other in a plan view. In the present embodiment, these stage 20 and rails 21 constitute a moving mechanism of the present disclosure. The configuration of the moving mechanism is not limited to the present embodiment, and the moving mechanism may take any configuration, for example, by making the stage 20 self-propelled type or the like.

Figure 3:
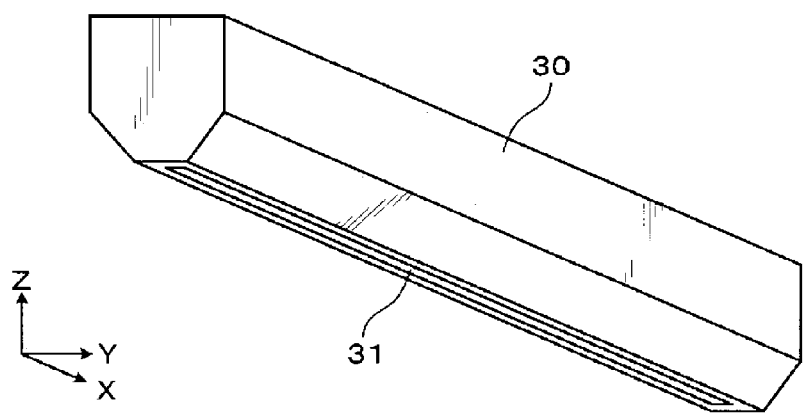
FIG. 3 is a perspective view illustrating a schematic configuration of a coating nozzle.

A coating nozzle 30 is provided above the stage 20 to apply the coating liquid to the glass substrate G held by the stage 20. The coating nozzle 30 is an elongated slit nozzle that extends in a same direction as a moving direction (X-axis direction) of the glass substrate G held by the stage 20. As illustrated in FIG. 3, an ejecting port 31 that eject the coating liquid to the glass substrate G is formed on a lower end surface of the coating nozzle 30. As illustrated in FIGS. 1 and 2, the ejecting port 31 is a slit-shaped ejecting port that extends a longer range than a moving range of the glass substrate G, that is, a longer range than a distance between the substrate position A1 and the substrate position A2, along a lengthwise direction (X-axis direction) of the coating nozzle 30.

A moving mechanism 32 is provided in the coating nozzle 30. The moving mechanism 32 moves the coating nozzle 30 in a direction (Y-axis direction) orthogonal to the moving direction (X-axis) of the glass substrate G held by the stage 20. The coating nozzle 30 moves between a negative direction side (indicated by a solid line in the drawing, nozzle position B1) of the Y-axis direction of the glass substrate G and a positive direction side (indicated by a dotted line in the drawing, nozzle position B2) of the Y-axis direction of the glass substrate G Further, the coating nozzle 30 is configured to be movable also in a vertical direction by the moving mechanism 32. The configuration of the moving mechanism 32 is not limited to the present embodiment, and the moving mechanism may take any configuration.

In this manner, the stage 20 and the coating nozzle 30 move in the orthogonal direction. Then, the coating nozzle 30 may apply the coating liquid to the glass substrate held by the stage 20. Further, by controlling the moving speed of the stage 20 and the moving speed of the coating nozzle 30, a coating direction of the coating liquid applied to the glass substrate G may be freely controlled.

The coating liquid ejected from the coating nozzle 30 is a coating liquid containing an optical material. Specifically, a coating liquid for a polarizing film for forming a linear polarizing film and a coating liquid for a wavelength film for forming a λ/4 wavelength film, for example, each of them contains arbitrary liquid crystal compounds, such as lyotropic liquid crystal compounds or thermotropic liquid crystal compounds as optical materials.

A coating liquid collecting unit 40 is provided below the stage 20 and the coating nozzle 30. A top surface of the collecting unit 40 is opened, so that the coating liquid may be temporarily stored. A length of the X-axis direction of the collecting unit 40 is longer than the ejecting port 31 of the coating nozzle 30. Further, a length of the Y-axis direction of the collecting unit 40 is longer than a moving range of the coating nozzle 30, that is, longer than a distance between the nozzle position B1 and the nozzle position B2. Further, a discharge pipe 41 that discharges the collected coating liquid is provided on a lower surface of the collecting unit 40. Then, the coating liquid that is ejected from the coating nozzle 30 and fell downward without being applied to the glass substrate G is collected by the collecting unit 40, and then discharged from the discharge pipe 41. The collected coating liquid is recycled for the glass substrate G to be processed subsequently.

A controller 50 is provided in the coating processing apparatus 10. The controller 50 is, for example, a computer, and includes a program storage unit (not illustrated). A program that controls the coating processing in the coating processing apparatus 10 is stored in the program storage unit. The program has been recorded in a computer-readable storage medium H such as a computer-readable hard disk (HD), a flexible disk (FD), a compact disk (CD), a magnet optical disk (MO), a memory card, and may be installed from the storage medium H to the controller 50. The controller 50 also controls a predetermined processing in other apparatuses of the optical film forming apparatus.

<1-2. Decompressive Drying Apparatus>

Figure 4:
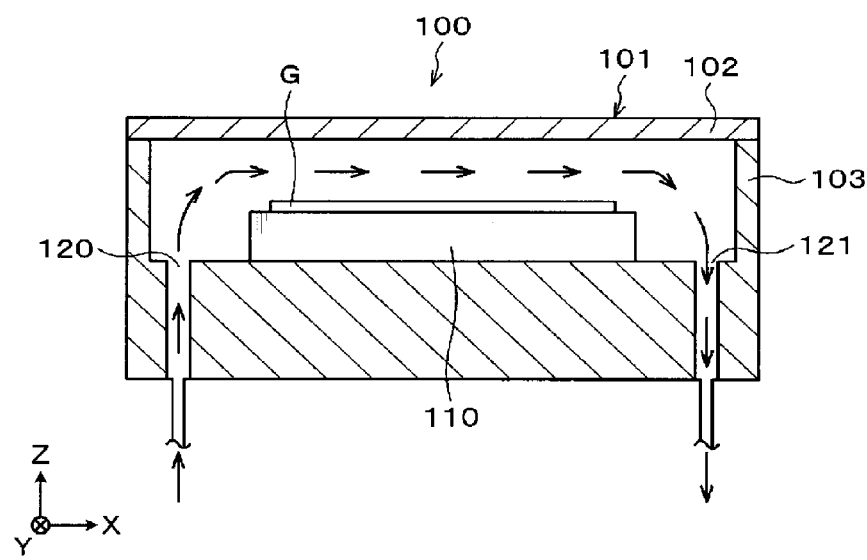
FIG. 4 is a vertical-sectional view illustrating a schematic configuration of a decompressive drying apparatus according to the present embodiment.

FIG. 4 is a vertical-sectional view illustrating a schematic configuration of a decompressive drying apparatus. In the decompressive drying apparatus 100, an optical film (the linear polarizing film and the λ/4 wavelength film) formed on the glass substrate G is decompressively dried.

The decompressive drying apparatus 100 includes a processing container 101. The processing container 101 includes a cover 102 and a main body 103. The cover 102 is configured to be elevatable by an elevating mechanism (not illustrated). When the glass substrate G is carried into the processing container 101, the cover 102 is separated upward from the main body 103, and when the decompressive drying processing is performed inside the processing container 101, the cover 102 and the main body 103 are united, and form a sealed space.

A placing table 110 is provided inside the processing container 101 to place the glass substrate G thereon. The placing table 110 places the glass substrate G such that a surface on which the optical film is formed faces upward. Further, a gas supply unit 120 and an exhaust unit are provided at a bottom portion of the processing container 101. The gas supply unit 120 and the exhaust unit 121 are arranged at the opposite side with the placing table 110 interposed therebetween. An inert gas is supplied from the gas supply unit 120 and airflow of the inert gas may be passed on the glass substrate G in an airflow passing direction (X-axis direction) parallel to the glass substrate G Further, by exhausting from the exhaust unit 121, the inside of the processing container 101 may be set in a decompressive atmosphere.

The configuration of the decompressive drying apparatus is not limited to the configuration of the decompressive drying apparatus 100 of the present embodiment, and any known configuration of a decompressive drying apparatus may be taken.

<1-3. Conveying Region>

Figure 5:
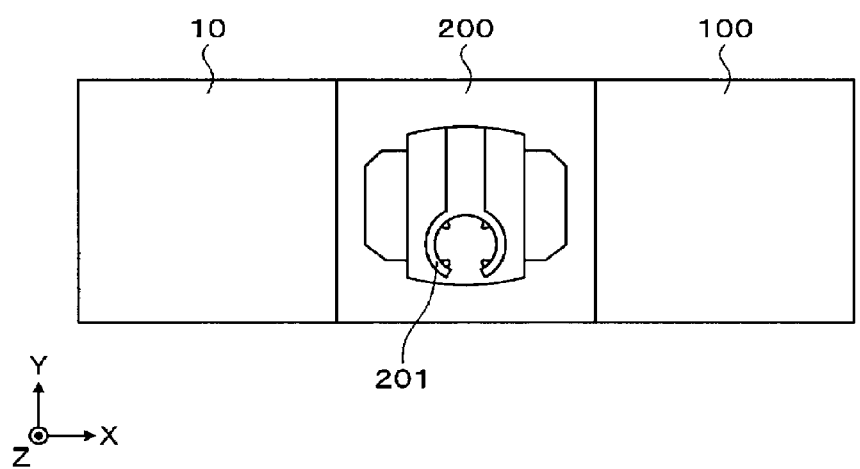
FIG. 5 is a plan view illustrating an arrangement of the coating processing apparatus, a drying processing apparatus, and a conveying region according to the present embodiment.

FIG. 5 is a plan view illustrating an arrangement of the coating processing apparatus, the drying processing apparatus, and a conveying region.

The coating processing apparatus 10 and decompressive drying apparatus 100 described above are arranged adjacent to each other via a conveying region 200. A conveying apparatus 201 that conveys the glass substrate G is provided in the conveying region 200. There is no down flow or the like in the inside of the conveying region 200, and the glass substrate G is conveyed in a no-wind state.

<1-4. Heating Processing Apparatus>

Figure 6:
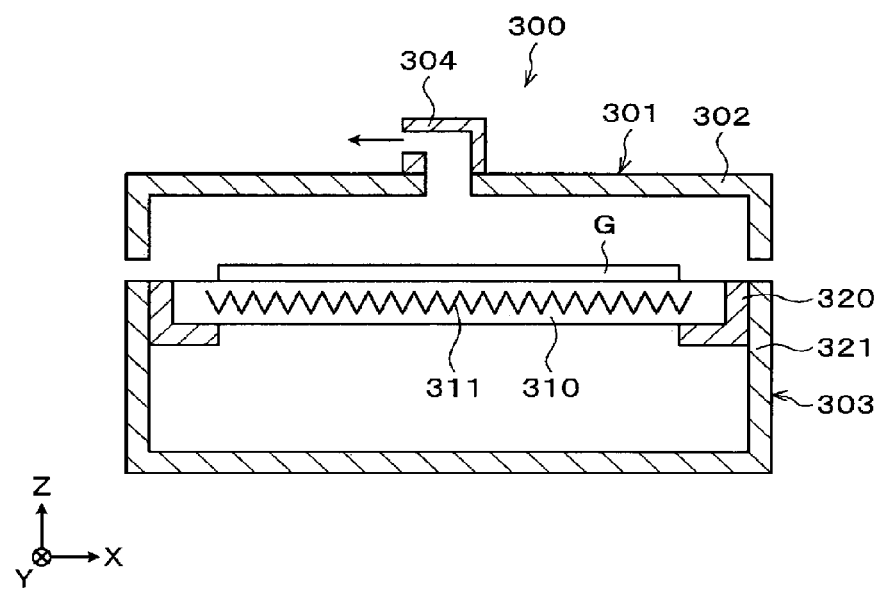
FIG. 6 is a vertical-sectional view illustrating a schematic configuration of a heating processing apparatus according to the present embodiment.

FIG. 6 is a vertical-sectional view illustrating a schematic configuration of a heating processing apparatus. In the heating processing apparatus 300, the optical film (the linear polarizing film and the λ/4 wavelength film) formed on the glass substrate G is heated.

The heating processing apparatus 300 includes a processing container 301. The processing container 301 includes a cover 302 and a main body 303. The cover 302 is configured to be elevatable by an elevating mechanism (not illustrated). When the glass substrate G is carried into/out from the processing container 301, the cover 302 is separated upward from the main body 303, and when the heating processing is performed inside the processing container 301, the cover 302 and the main body 303 are united, and form a sealed space. An exhaust unit 304 is provided on a center portion of the top surface of the cover 302. The inside of the processing container 301 is exhausted from the exhaust unit 304.

A heat plate 310 is provided inside the processing container 301 to place thereon and heat the glass substrate G The heat plate 310 places the glass substrate G such that a surface on which the optical film is formed faces upward. A heater 311 that generates heat when power is supplied is incorporated in the heat plate 310.

The main body 303 includes a holding member 320 that accommodates the heat plate 310 and hods an outer peripheral portion of the heat plate 310, and a support ring 321 that surrounds the outer periphery of the holding member 320.

The configuration of the heating processing apparatus is not limited to the configuration of the heating processing apparatus 300 of the present embodiment, and any known configuration of a heating processing apparatus may be taken.

<1-5. Film Fixing Apparatus>

Figure 7:
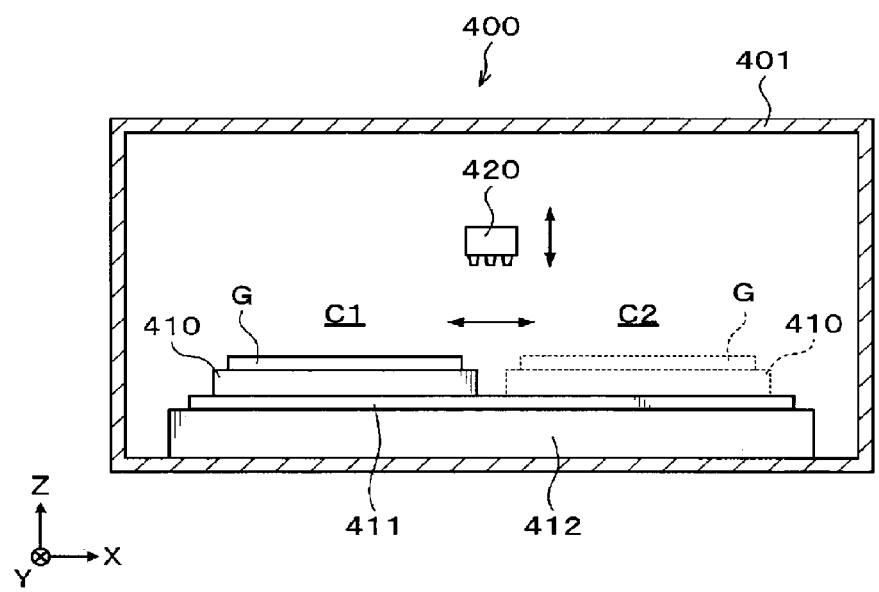
FIG. 7 is a vertical-sectional view illustrating a schematic configuration of a film fixing apparatus according to the present embodiment.

FIG. 7 is a vertical-sectional view illustrating a schematic configuration of a film fixing apparatus. In the film fixing apparatus 400, a fixing material is selectively applied to a predetermined region, in this embodiment, to a pixel region of the glass substrate G by an inkjet type.

The film fixing apparatus 400 includes a processing container 401. A carry-in/out port (not illustrated) for the glass substrate G is formed on a side surface of the processing container 401, and an open/close shutter (not illustrated) is provided at the carry-in/out port.

A stage 410 that holds the glass substrate G is provided inside the processing container 401. The stage 410 absorbs and holds a back surface of the glass substrate G such that a surface thereof to which the fixing material is applied faces upward.

The stage 410 is adhered to a pair of rails 411 and 411 which are provided on a lower surface side of the stage 410 and extend in the X-axis direction. The rails 411 are provided on a table 412 that extends in the X-axis direction. Then, the stage 410 is configured to be movable along the rails 411.

Further, the rails 411 extend in the X-axis direction at least longer than a length of the two glass substrates G with a coating nozzle 420 (to be described later) interposed therebetween. Therefore, the glass substrate G (indicated by a solid line in the drawing, substrate position C1) in a case where the stage 410 is positioned at an end portion in a negative direction of the X-axis direction and the glass substrate G (indicated by a dotted line in the drawing, substrate position C2) in a case where the stage 410 is positioned at an end portion in a positive direction of the X-axis direction do not overlap with each other in a plan view.

A coating nozzle 420 is provided above the stage 410 to apply the fixing material to the glass substrate G held by the stage 410. The coating nozzle 420 is, for example, an inkjet nozzle, and may selectively apply the fixing material to a predetermined region of the glass substrate G Further, the coating nozzle 420 is configured to be movable also in a vertical direction by the moving mechanism (not illustrated).

Any material may be used as the fixing material ejected from the coating nozzle 420 as long as the fixing material fixes the optical film to a predetermined region of the glass substrate G For example, the optical film may be inactivated (insolubilized) and fixed by substituting a functional group at the end of the optical film or causing a polymerization by a shrinkage reaction. Alternatively, the optical film may be hardened and fixed.

Further, the configuration of the film fixing apparatus is not limited to the configuration of the film fixing apparatus 400 of the present embodiment, and any known configuration of an inkjet type apparatus may be taken. Further, the method of selectively applying the fixing material in the film fixing apparatus is not limited to the inkjet type, and other methods may be used. As the other methods, for example, a mask may be provided on a region other than the predetermined region, and the fixing material may be ejected from above such that the fixing material is selectively applied only to the predetermined region.

<1-6. Film Removing Apparatus>

Figure 8:
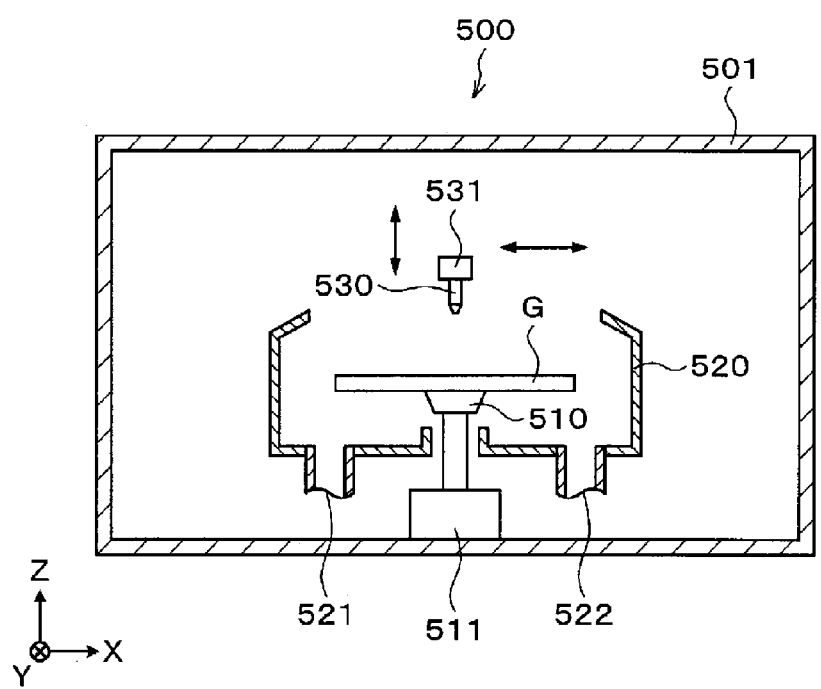
FIG. 8 is a vertical-sectional view illustrating a schematic configuration of a film removing apparatus according to the present embodiment.

FIG. 8 is a vertical-sectional view illustrating a schematic configuration of a film removing apparatus. In the film removing apparatus 500, the optical film (optical film other than the predetermined region) that is not fixed by the film fixing apparatus 400 is selectively removed by supplying a cleaning liquid to the glass substrate G.

The film removing apparatus 500 includes a processing container 501. A carry-in/out port (not illustrated) for the glass substrate G is formed on a side surface of the processing container 501, and an open/close shutter (not illustrated) is provided at the carry-in/out port.

A spin chuck 510 is provided inside the processing container 501 to be rotated while holding the glass substrate G The stage 510 absorbs and holds a back surface of the glass substrate G such that a surface thereof to which the cleaning liquid is supplied faces upward. Further, the spin chuck 510 may be rotated at a predetermined speed by a chuck driving unit 511 such as, for example, a motor.

A cup 520 is provided around the spin chuck 510 to receive and collect the cleaning liquid scattered or fallen from the glass substrate G. A lower surface of the cup 520 is connected with a discharge pipe 521 that discharges the collected cleaning liquid, and an exhaust pipe 522 that exhausts inside the cup 520.

A cleaning nozzle 530 is provided above the spin chuck 510 to supply the cleaning liquid to the glass substrate G held by the stage 510. The cleaning nozzle 530 is configured to be movable also in a horizontal direction and a vertical direction by a moving mechanism 531.

As the cleaning liquid supplied from the cleaning nozzle 530, a material is used depending on a solvent of the fixing material applied by the film fixing apparatus 400. For example, when the solvent of the fixing material is water, water is used as the cleaning liquid, or when the solvent of the fixing material is an organic solvent, an organic solvent is used as the cleaning liquid.

Further, the configuration of the film removing apparatus is not limited to the configuration of the film removing apparatus 500 of the present embodiment, and any known configuration of a spin coating type apparatus may be taken. Further, the method of selectively removing the optical film in the film removing apparatus is not limited to the spin coating type, and other methods may be used. As another method, for example, the optical film may be selectively removed by immersing the glass substrate G in a cleaning bath that temporarily stores the cleaning liquid. Further, the optical film may be selectively removed by performing laser ablation, or the optical film may be selectively removed by performing photolithography processing and etching processing.

<2. Optical Film Forming Method>

Figure 9:
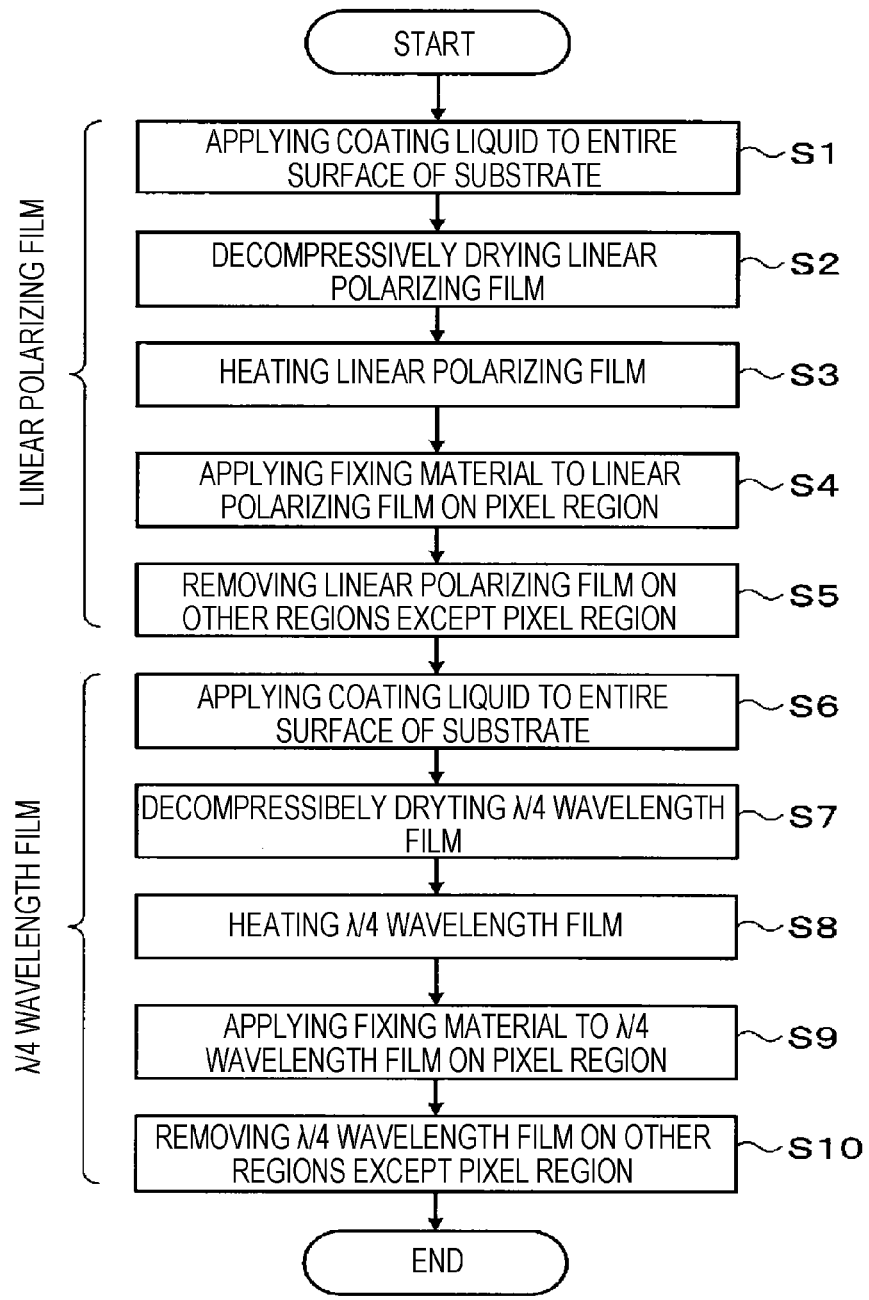
FIG. 9 is a flow chart illustrating an example of main steps of the optical film forming processing according to the present embodiment.

Next, an optical film forming method performed by using the optical forming apparatus configured as described above will be described. FIG. 9 is a flow chart illustrating an example of main steps of the optical film forming processing. In the present embodiment, as described above, as an optical film, a linear polarizing film and a λ/4 wavelength film are formed by laminating on the glass substrate G such that polarizing axes thereof cross each other at 45 degrees. Steps S1 to S5 are steps for forming the linear polarizing film, and steps S6 to S10 are steps for forming the λ/4 wavelength film.

<2-1. Step S1>

First, in the coating processing apparatus 10, a coating liquid is applied to an entire surface of the glass substrate G. In this case, the coating liquid is a coating liquid for a polarizing film for forming the linear polarizing film.

In the coating processing apparatus 10, the glass substrate G is held by the stage 20 at the substrate position A1. Then, as illustrated in FIGS. 10A to 10C, the glass substrate G is not moved from the substrate position A1, and the coating nozzle 30 is moved from the nozzle position B1 to the nozzle position B2.

Figure 10A:
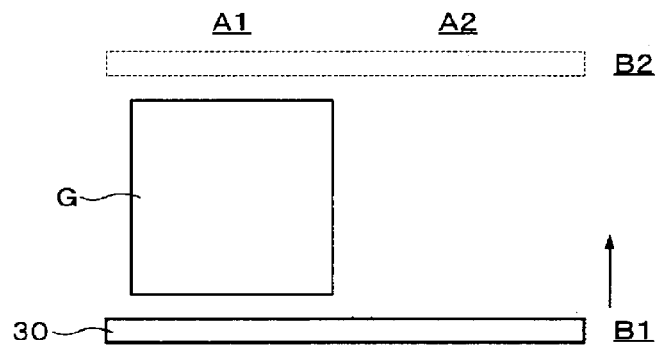
FIGS. 10A to 10C are explanatory views illustrating an operation of a glass substrate and the coating nozzle in step S1.
Figure 11:
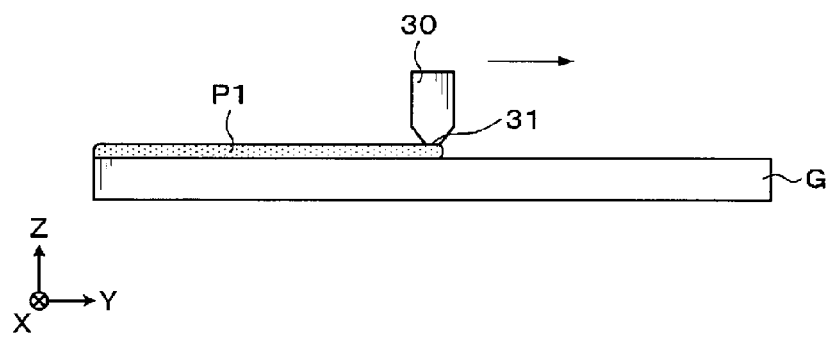
FIG. 11 is an explanatory view illustrating the operation of the glass substrate and the coating nozzle in step S1.
Figure 12:
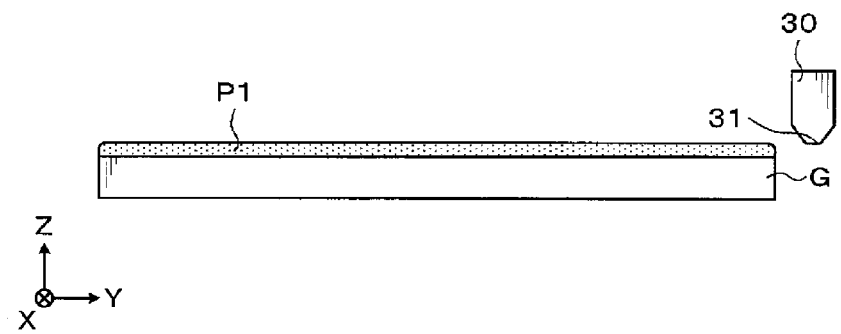
FIG. 12 is an explanatory view illustrating the operation of the glass substrate and the coating nozzle in step S1.

As illustrated in FIG. 10A, when the coating nozzle 30 is arranged at the nozzle position B1, the coating nozzle 30 is arranged at a height depending on a target film thickness of a coating liquid P1. Subsequently, as illustrated in FIGS. 10B and 11, the coating nozzle 30 is moved in the positive direction of the Y-axis while ejecting the coating liquid P1 from the coating nozzle 30, so that the coating liquid P1 is applied to the glass substrate G Then, as illustrated in FIGS. 10C and 12, the coating nozzle 30 is moved to the nozzle position B2, so that the coating liquid P1 is applied to the entire surface of the glass substrate G.

Figure 10B:
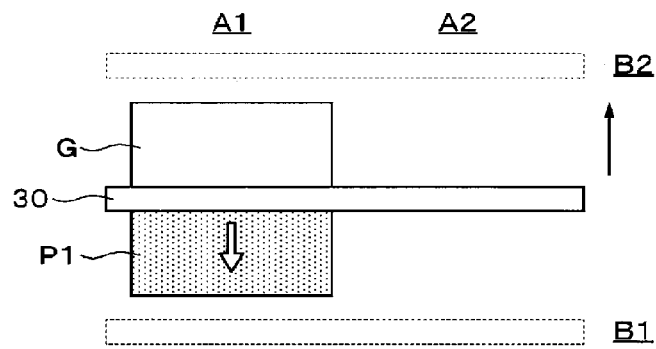
Figure 10C:
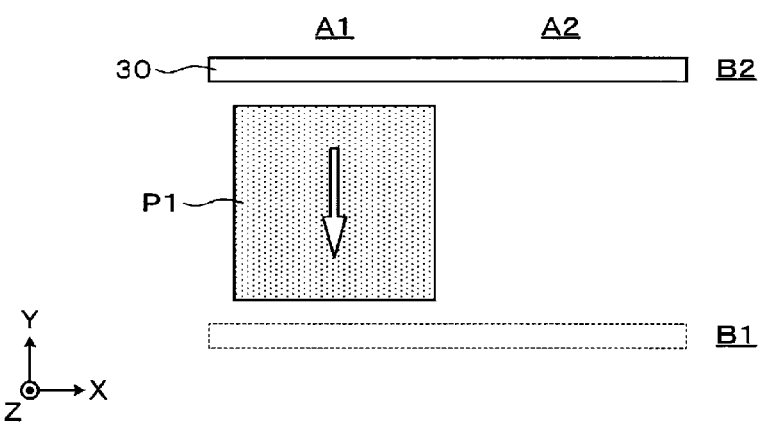

At this time, the coating liquid P1 is applied while applying shear stress (block arrow in FIGS. 10A to 10C). Since the glass substrate G does not move and the coating nozzle 30 moves in the positive direction of the Y-axis direction, the shear stress is applied in the negative direction of the Y-axis direction.

Further, the shear stress (shear rate) is a value obtained by dividing the coating speed (moving speed of the coating nozzle 30 with respect to the glass substrate G) by a distance (gap) between the glass substrate G and the ejecting port 31 of the coating nozzle 30. Since a slit nozzle is used for the coating nozzle 30, the coating nozzle 30 may be sufficiently close to the glass substrate G without damaging the glass substrate G Therefore, the gap may be decreased. Then, by controlling the moving speed of the coating nozzle 30, sufficient shear stress may be applied to the coating liquid P1. Further, as a result, molecules in the coating liquid P1 may be oriented in one direction (Y-axis direction).

Although other nozzles other than the slit nozzle may be used for the coating nozzle 30, from the viewpoint that the gap may be made as small as possible as described above, the slit nozzle is appropriate. Further, the film thickness of the coating liquid P1 applied to the glass substrate G is small, and also from this viewpoint, the slit nozzle is suitable.

The coating liquid P1 that is not applied to the glass substrate G among the coating liquid P1 ejected from the coating nozzle 30 falls downward and is collected by the collecting unit 40. The collected coating liquid P1 is recycled for the glass substrate G to be processed subsequently. Further, since the stage 20 is smaller than the glass substrate G, the coating liquid P1 is not adhered to the stage 20. Therefore, it is possible to suppress the stage 20 from being cleaned with every single sheet for each glass substrate G.

In this manner, in the coating processing apparatus 10, the coating liquid P1 is applied to the glass substrate G, and the linear polarizing film is formed. In the following description, the linear polarizing film will be described as P1.

<2-2. Step S2>

Next, in the decompressive drying apparatus 100, the linear polarizing film P1 of the glass substrate G is decompressively dried. Specifically, the glass substrate G is placed on the placing table 110, and the cover 102 is closed, so that a sealed space is formed inside the processing container 101. Thereafter, an inert gas is supplied from the gas supply unit 120, and the inside of the processing container 101 is exhausted from the exhaust unit 121, so that the inside of the processing container 101 is set to a decompressive atmosphere. Then, the linear polarizing film P1 is dried.

When the linear polarizing film P1 is dried, a solvent in the film is removed. In the step S1 described above, the molecules are oriented in one direction by applying sheer stress, but when the film is left as it is, the orientation of the molecules may return to the original orientation and be disturbed. Therefore, by removing the solvent in the film in the step S2, the orientation state of the molecules are maintained properly.

Further, from a viewpoint of properly maintaining the orientation state of the molecules, the glass substrate G is conveyed with the conveying region 200 between the coating processing apparatus 10 and the decompressive drying apparatus 100 in a no-wind state. For example, if a down flow or the like is generated in the conveying region 200, the wind colliding with the glass substrate G may not be uniform, so that there is a possibility that the orientation state of the molecules may not be uniform. Therefore, in the present embodiment, it is suppressed that the orientation state of the molecules is disturbed as a result of the disturbance of the linear polarizing film P1, by making the conveying region 200 in the no-wind state until the decompressive drying processing is performed.

<2-3. Step S3>

Next, in the heating processing apparatus 300, the linear polarizing film P1 of the glass substrate G is heated. Specifically, the glass substrate G is placed on the heat plate 310, and the cover 302 is closed, so that a sealed space is formed inside the processing container 101. Then, by the heater 311 of the heat plate 310, the linear polarizing film P1 is heated to a predetermined temperature, for example, to 50° C.

For example, when the linear polarizing film P1 is decompressively dried in the step S2, there is a case where the solvent in the film is not completely removed. The heating of the linear polarizing film P1 in the step S3 reliably removes such solvent remained in the film. In a case where the solvent in the film can be completely removed in the step S2, the step S3 may be omitted.

<2-4. Step S4>

Next, in the film fixing apparatus 400, a fixing material is applied to a predetermined region of the glass substrate G, in the present embodiment, to the pixel region.

In the film fixing apparatus 400, the glass substrate G is held by the stage 410 at the substrate position C1. Then, the glass substrate G is moved from the substrate position C1 to the substrate position C2.

Figure 13:
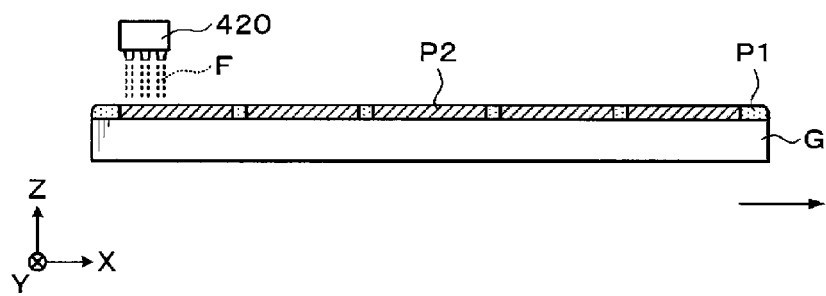
FIG. 13 is an explanatory view illustrating a state where a linear polarizing film is being fixed by applying a fixing material in step S4.

During the movement of the glass substrate G, as illustrated in FIG. 13, a fixing material F is applied from the coating nozzle 420 to the linear polarizing film P1 formed on the pixel region of the glass substrate G. At this time, since the film fixing apparatus 400 adopts the inkjet type, the fixing material F may be accurately applied to the linear polarizing film P1 in the pixel region.

The fixing material F inactivates (insolubilizes) the linear polarizing film P1. Specifically, a water-soluble distal end such as an OH group in the linear polarizing film P1 is substituted by another functional group. Then, the inactivated linear polarizing film P1 is fixed to the glass substrate G Hereinafter, the linear polarizing film to which the fixing material F is applied and fixed will be described as P2. That is, in the region of the glass substrate G other than the pixel region, the linear polarizing film P1 is not inactivated and is not fixed. Meanwhile, in the pixel region, the linear polarizing film P2 is inactivated and fixed.

Figure 14:
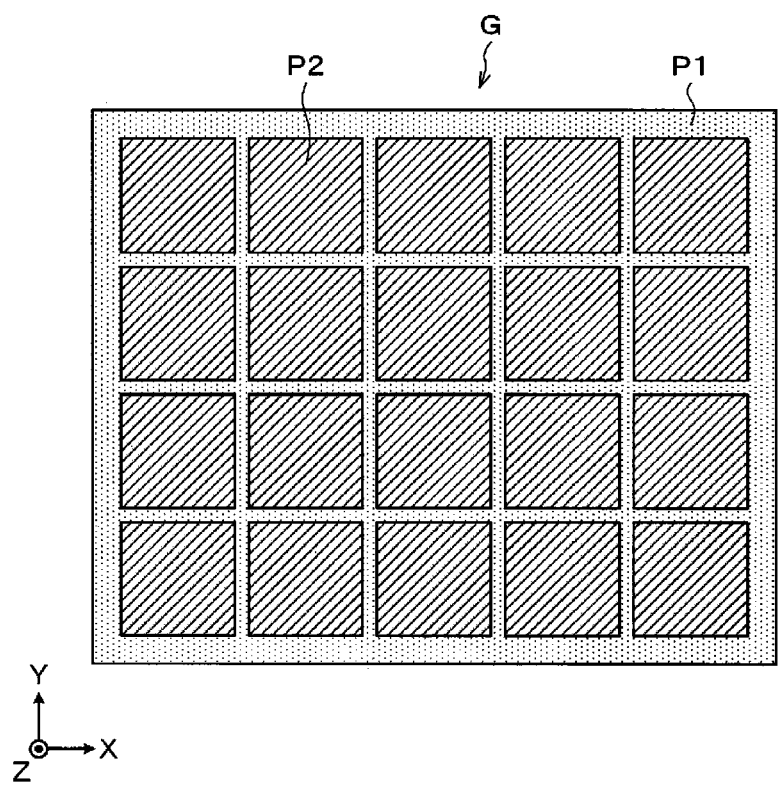
FIG. 14 is an explanatory view illustrating a state where the linear polarizing film is fixed in step S4.

Then, as illustrated in FIG. 14, the inactivated linear polarizing film P2 may be formed on the entire pixel region of the glass substrate G For convenience of illustration, a case where the number of the pixel region of the glass substrate, that is, the number of the linear polarizing film P2 is 20 is illustrated, but the number of the pixel region is not limited thereto. Actually, the number of the pixel region is approximately 100 for the one glass substrate G.

<2-5. Step S5>

Next, in the film removing apparatus 500, the linear polarizing film P1 that is not fixed in the step S4 is selectively removed by supplying a cleaning liquid to the glass substrate G.

Figure 15:
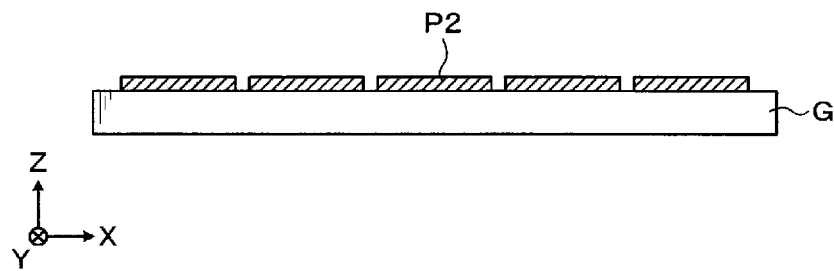
FIG. 15 is an explanatory view illustrating a state where a linear polarizing film that is not fixed is removed in step S5.
Figure 16:
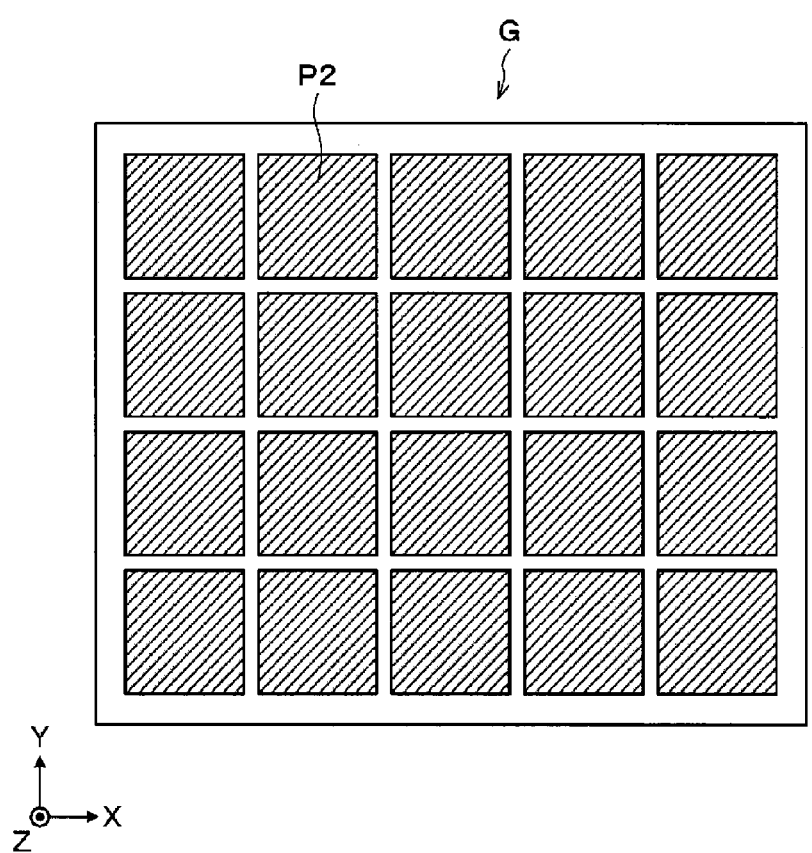
FIG. 16 is an explanatory view illustrating a state where the linear polarizing film that is not fixed is removed in step S5.

In the film removing apparatus 500, the glass substrate G is absorbed and held by the spin chuck 510. Thereafter, the cleaning liquid is supplied from the cleaning nozzle 530 to a center portion of the glass substrate G while rotating the glass substrate G held by the spin chuck 510. The supplied cleaning liquid is spread on the glass substrate G by centrifugal force. At this time, since the linear polarizing film P2 to which the fixing material F is applied is fixed, the linear polarizing film P2 is not removed by the cleaning liquid. Meanwhile, since the linear polarizing film P1 to which the fixing material F is not applied is not fixed, the linear polarizing film P1 is removed by the cleaning liquid. Therefore, as illustrated in FIGS. 15 and 16, only the linear polarizing film P1 is selectively removed, and on the glass substrate G, only the linear polarizing film P2 is formed on the pixel region.

<2-6. Step S6>

As described above, the linear polarizing film P2 is formed on the glass substrate G, and subsequently, the λ/4 wavelength film is further formed on the glass substrate G. First, in the coating processing apparatus 10, a coating liquid is applied to the entire surface of the glass substrate G In this case, the coating liquid is a coating liquid for a wavelength film for forming the λ/4 wavelength film.

Figure 17A:
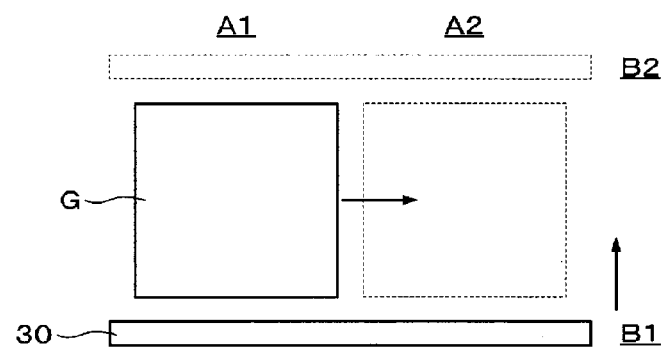
FIGS. 17A to 17C are explanatory views illustrating an operation of the glass substrate and the coating nozzle in step S6.
Figure 17B:
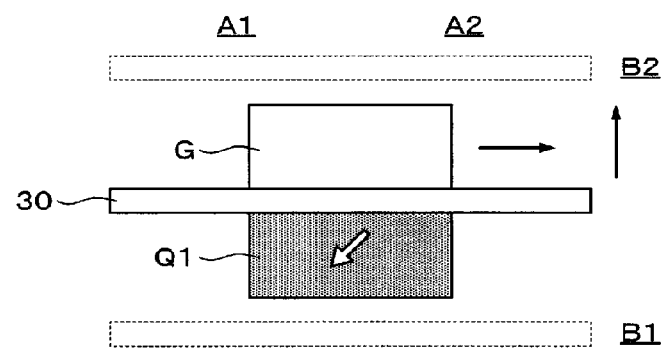
Figure 17C:
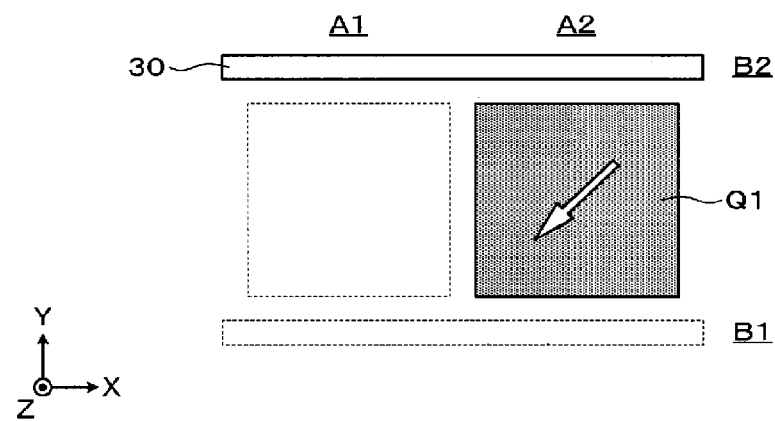

In the coating processing apparatus 10, the glass substrate G is held by the stage 20 at the substrate position A1. Then, as illustrated in FIGS. 17A to 17C, the glass substrate G is moved from the substrate position A1 to the substrate position A2, and the coating nozzle 30 is moved from the nozzle position B1 to the nozzle position B2. At this time, the moving speed of the glass substrate G is the same as the moving speed of the coating nozzle 30.

Figure 18:
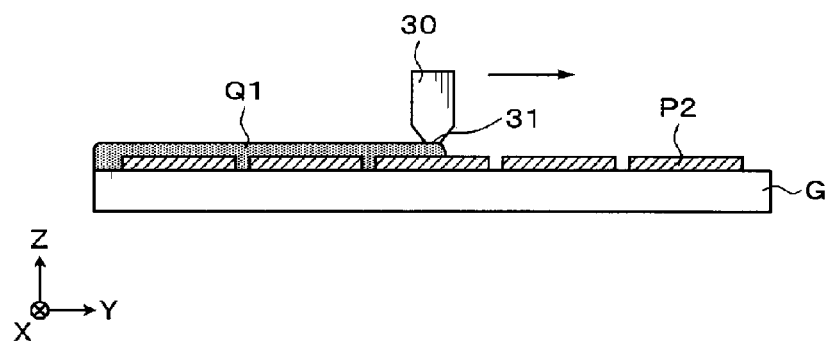
FIG. 18 is an explanatory view illustrating the operation of the glass substrate and the coating nozzle in step S6.
Figure 19:
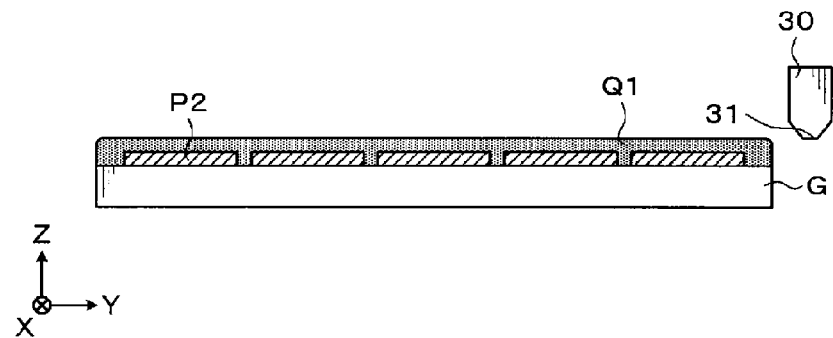
FIG. 19 is an explanatory view illustrating the operation of the glass substrate and the coating nozzle in step S6.

As illustrated in FIG. 17A, when the coating nozzle 30 is arranged at the nozzle position B1, the coating nozzle 30 is arranged at a height depending on a target film thickness of a coating liquid Q1. Subsequently, as illustrated in FIGS. 17B and 18, the coating nozzle 30 is moved in the positive direction of the Y-axis while moving the glass substrate G in the positive direction of the X-axis direction and ejecting the coating liquid Q1 from the coating nozzle 30, so that the coating liquid Q1 is applied to the glass substrate G. Then, as illustrated in FIGS. 17C and 19, the glass substrate G is moved to the substrate position A2 and the coating nozzle 30 is moved to the nozzle position B2, so that the coating liquid Q1 is applied to the entire surface of the glass substrate G.

At this time, the coating liquid Q1 is applied while shear stress (block arrow in FIGS. 17B and 17C) is applied. That is, since the moving speed of the glass substrate G is the same as the moving speed of the coating nozzle 30, shear stress is applied in a direction of inclination of 45 degrees in the negative direction of the Y-axis direction and the negative direction of the X-axis direction.

Further, sufficient shear stress may be applied to the coating liquid Q1 by controlling the moving speed of the glass substrate G and the moving speed of the coating nozzle 30. As a result, molecules in the coating liquid Q1 may be oriented in one direction (direction of inclination of 45 degrees).

In this manner, in the coating processing apparatus 10, the coating liquid Q1 is applied to the glass substrate G, and the λ/4 wavelength film is formed. In the following description, the λ/4 wavelength film will be described as Q1.

<2-7. Step S7>

Next, in the decompressive drying apparatus 100, the λ/4 wavelength film Q1 of the glass substrate G is decompressively dried. Since the specific decompressive drying processing is the same as the step S2, the description thereof will be omitted. Then, the solvent in the λ/4 wavelength film Q1 is removed, and the orientation state of molecules in the film is properly maintained.

<2-8. Step S8>

Next, in the heating processing apparatus 300, the λ/4 wavelength film Q1 of the glass substrate G is heated. Since the specific heating processing is the same as the step S3, the description thereof will be omitted. Then, the solvent in the λ/4 wavelength film Q1 is completely removed. In a case where the solvent in the film can be completely removed in the step S7, the step S8 may be omitted.

<2-9. Step S9>

Figure 20:
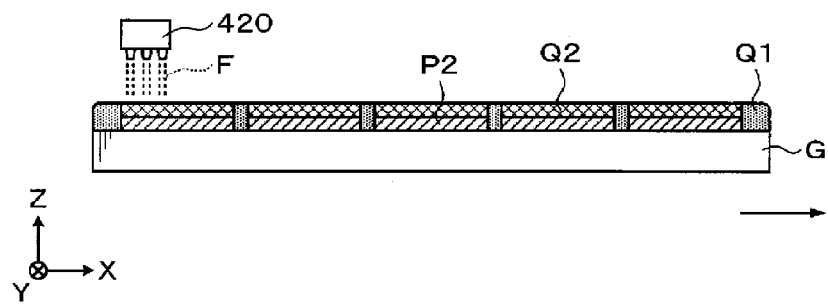
FIG. 20 is an explanatory view illustrating a state where a λ/4 wavelength film is being fixed by applying a fixing material in step S9.
Figure 21:
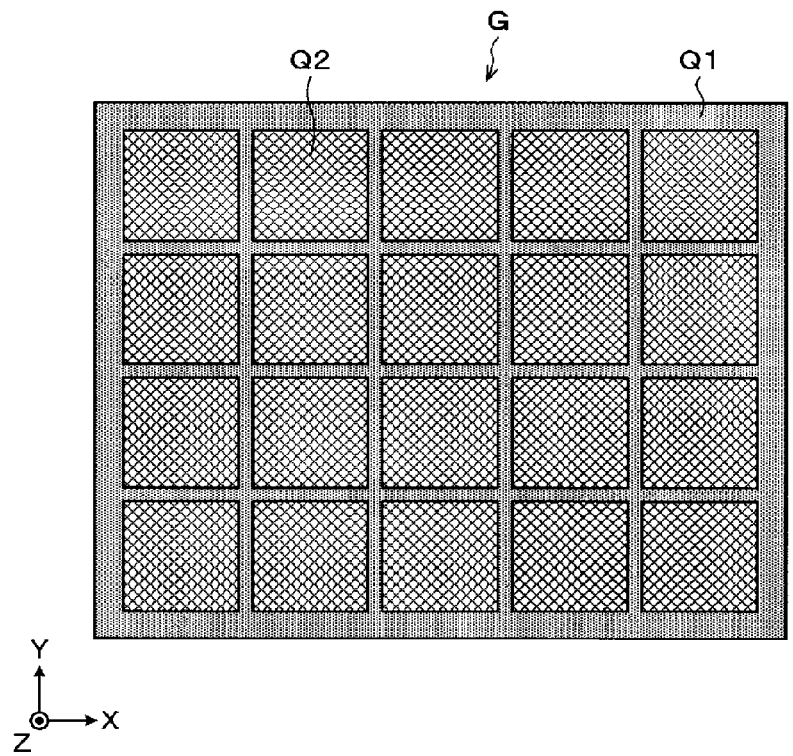
FIG. 21 is an explanatory view illustrating a state where the λ/4 wavelength film is fixed in step S9.

Next, in the film fixing apparatus 400, as illustrated in FIG. 20, a fixing material F is applied from the coating nozzle 420 to the λ/4 wavelength film Q1 formed on the pixel region of the glass substrate G Since the specific selective applying processing of the fixing material F is the same as the step S4, the description thereof will be omitted.

The fixing material F inactivates (insolubilized) the λ/4 wavelength film Q1, and the inactivated λ/4 wavelength film Q1 is fixed to the glass substrate G Hereinafter, the λ/4 wavelength film to which the fixing material F is applied and fixed will be described as Q2. That is, in the region of the glass substrate G other than the pixel region, the λ/4 wavelength film Q1 is not inactivated and is not fixed. Meanwhile, in the pixel region (linear polarizing film P2), the λ/4 wavelength film Q2 is inactivated and fixed.

<2-10. Step S10>

Figure 22:
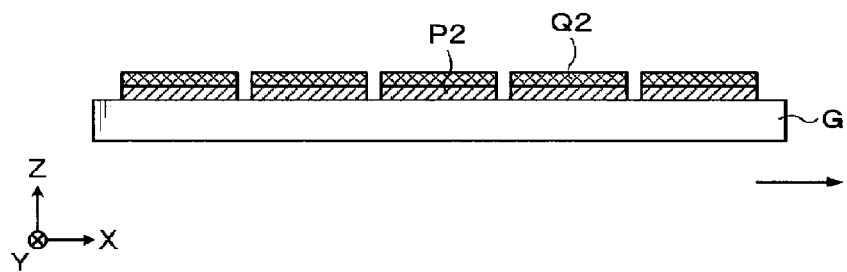
FIG. 22 is an explanatory view illustrating a state where a λ/4 wavelength film that is not fixed is removed in step S10.
Figure 23:
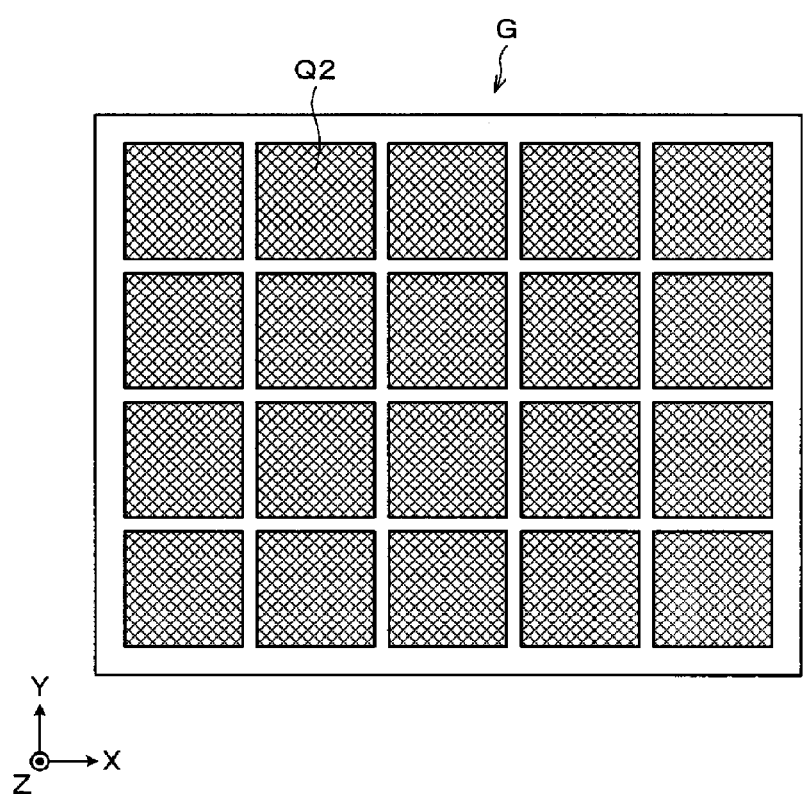
FIG. 23 is an explanatory view illustrating a state where the λ/4 wavelength film that is not fixed is removed in step S10.

Next, in the film removing apparatus 500, the λ/4 wavelength film Q1 that is not fixed in the step S9 is selectively removed by supplying a cleaning liquid to the glass substrate G Since the specific selective removing processing of the λ/4 wavelength film Q1 is the same as the step S5, the description thereof will be omitted. Then, as illustrated in FIGS. 22 and 23, on the glass substrate G, only the λ/4 wavelength film Q2 is formed on the pixel region.

According to the embodiment described above, in the coating processing apparatus 10, since the glass substrate G held by the stage 20 and the coating nozzle 30 move in the orthogonal direction, respectively, the coating direction of the coating liquid applied to the glass substrate G may be controlled by controlling the moving speed of the glass substrate G and the moving speed of the coating nozzle 30. With such a simple configuration and simple control, the coating liquid may be applied to the glass substrate G at an arbitrary angle. Then, the linear polarizing film P1 and the λ/4 wavelength film Q1 are formed such that polarizing axes thereof cross each other at 45 degrees by crossing the coating direction of the coating liquid P1 in the step S1 and the coating direction of the coating liquid Q1 in the step S6 at 45 degrees.

Since the linear polarizing film P1 is decompressively dried in the step S2, the orientation state of the molecules in the linear polarizing film P1 may be properly maintained. Similarly, since the λ/4 wavelength film Q1 is decompressively dried in the step S6, the orientation state of the molecules in the λ/4 wavelength film Q1 may be properly maintained.

As long as the step S2 and the step S6 are for drying the linear polarizing film P1 and the λ/4 wavelength film Q1, the step S2 and the step S6 are not limited to the decompressive drying. For example, the linear polarizing film P1 and the λ/4 wavelength film Q1 may be naturally dried, may be dried by performing a heating processing, or may be dried by spraying a blow, respectively.

However, the decompressive drying in the present embodiment is more preferable since the decompressive drying may be completed in a shorter time than the natural drying. Further, for example, when performing a heating processing or spraying a blow, the solvent in the film may be convected and the orientation state of the molecules in the film may be disturbed by the convection, but the decompressive drying of the present embodiment is more preferable since the convection of the solvent in the film may be suppressed.

Further, the linear polarizing film P1 is selectively removed by selectively applying the fixing material F to the linear polarizing film P1 on the pixel region in the step S4 and by not applying the fixing material F in step S5, and thus, the linear polarizing film P2 is formed only on the pixel region. Similarly, by performing the step S9 and the step S10, the λ/4 wavelength film Q2 is formed only on the pixel region.

Here, for example, in a case where a circular polarizing plate is produced, the linear polarizing film and the λ/4 wavelength film may be formed only on the pixel region. When the films are formed on a region other than the pixel region, there is a possibility that terminals provided around the pixel region may not function properly. In the present embodiment, since the films are not formed other than the pixel region, functions of components around the pixel region may be exerted while exerting the functions of the linear polarizing film P2 and the λ/4 wavelength film Q2 on the pixel region.

Further, in the step S1 and the step S6, the coating liquids P1 and Q1 are applied while applying shear stress, respectively, but at this time, it is difficult to apply the coating liquids P1 and Q1 to only the pixel region. Therefore, it is useful to perform the steps S4, S5, S9, and S10, and selectively forms the linear polarizing film P2 and the λ/4 wavelength film Q2 on the pixel region.

In a case where the linear polarizing film P1 is formed by applying the coating liquid P1 to the glass substrate G in the step S1, and then the selective applying of the fixing material F in the step S4 is omitted, when the coating liquid Q1 is then applied to the glass substrate G in the step S6, there is a possibility that the coating liquid Q1 is mixed with the linear polarizing film P1. In this aspect, by forming the linear polarizing film P2 that is insolubilized by performing the step S4 as in the present embodiment, it is possible to suppress mixing of the linear polarizing film P2 and the coating liquid Q1. Therefore, the linear polarizing film P2 and the λ/4 wavelength film Q2 may be properly formed.

Performing these steps S4, S5, S9, and S10 are not necessarily required. When a plurality of pixel regions are exist on the glass substrate G as in the present embodiment, it is useful to perform the steps S4, S5, S9, and S10, but for example, in a case where the linear polarizing film and the λ/4 wavelength film are formed on the entire surface of the glass substrate G, the steps S4, S5, S9, and S10 may be omitted.

Further, in the step S4 and the step S9, in the film fixing apparatus 400, the linear polarizing film and the λ/4 wavelength film are fixed by applying the fixing material, other methods may be used. As other methods, for example, when a material that reacts with light is added to the linear polarizing film and the λ/4 wavelength film in advance, crystals of the linear polarizing film and the λ/4 wavelength film are polymerized by irradiation of the light, and then the linear polarizing film and the λ/4 wavelength film may be insolubilized and fixed.

OTHER EMBODIMENTS

In the embodiment described above, in the coating processing apparatus 10, the glass substrate G held by the stage 20 is moved in the X-axis direction, and the coating nozzle 30 is moved in the Y-axis direction, but the glass substrate G and the stage 20 may be moved in a direction relatively orthogonal with each other.

Figure 24:
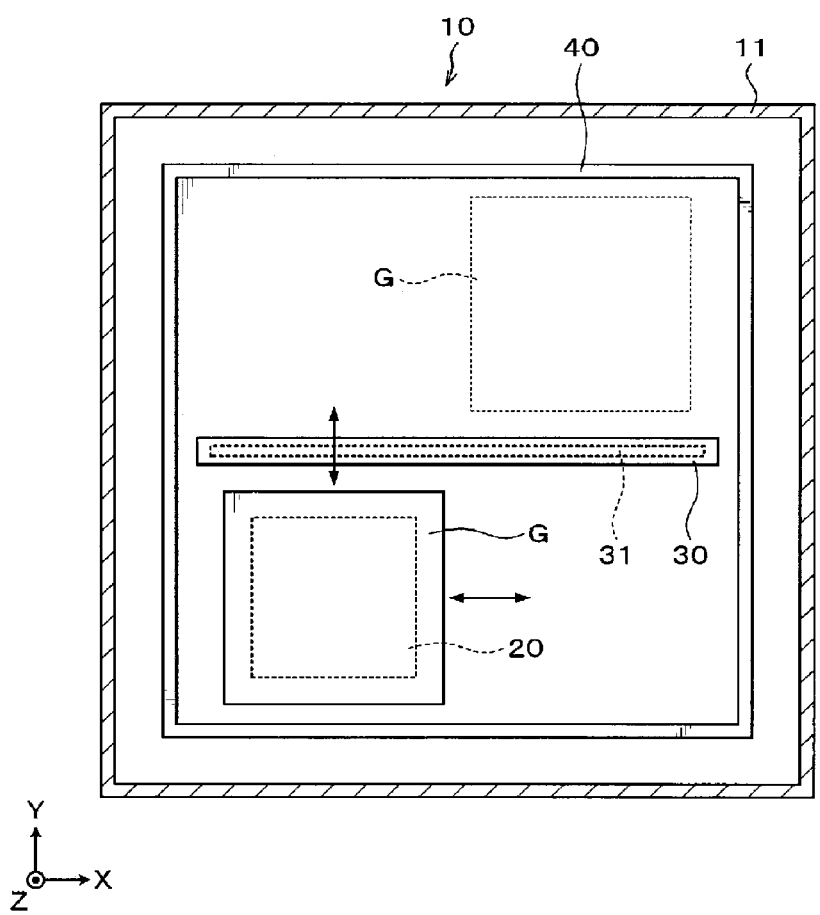
FIG. 24 is a cross-sectional view illustrating a schematic configuration of a coating processing apparatus according to another embodiment.

As illustrated in FIG. 24, the glass substrate G held by the stage 20 may be moved in the horizontal direction (X-axis direction and the Y-axis direction), and the coating nozzle may be fixed without being moved.

The coating nozzle 30 is provided to extend in the X-axis direction and to be fixed. By a moving mechanism (not illustrated), the stage 20 is moved to a direction (X-axis direction) the same as the extending direction of the coating nozzle 30, and is moved in the Y-axis direction across coating nozzle 30. Further, a coating liquid collecting unit 40 is provided below the stage 20 and the coating nozzle 30.

The configurations of the stage 20, the coating nozzle 30, and the collecting unit 40 are the same as those of the stage 20, the coating nozzle 30, and the collecting unit 40 in the above-described embodiment, respectively. The difference between the present embodiment and the above-described embodiment is the movement of the stage 20 and the coating nozzle 30.

Figure 25A:
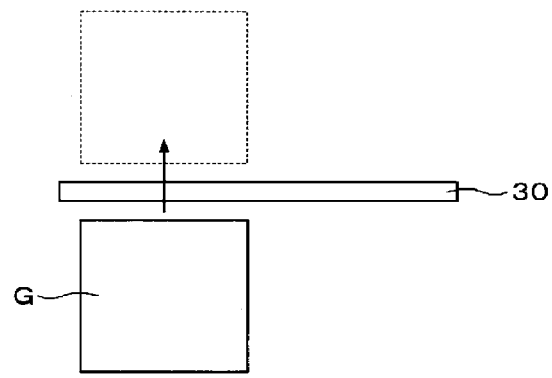
FIGS. 25A to 25C are explanatory views illustrating an operation of a glass substrate and a coating nozzle in step S1 of another embodiment.
Figure 25B:
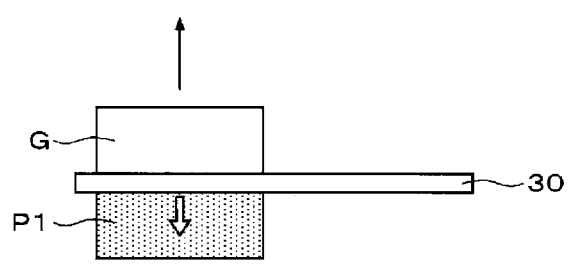
Figure 25C:
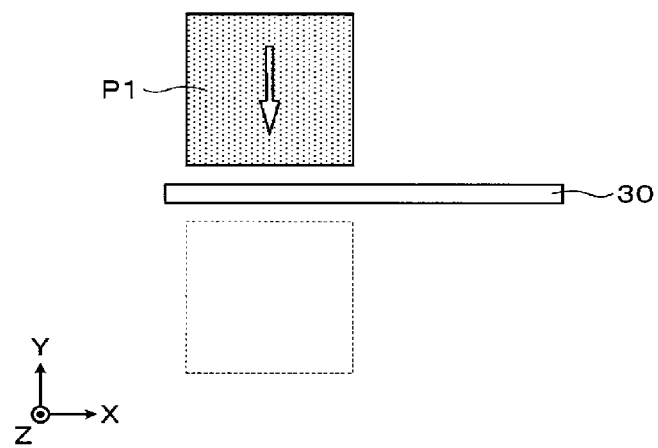

In this case, in the step S1, as illustrated in FIG. 25A, the glass substrate G held by the stage 20 is arranged in the negative direction side of the Y-axis direction of the coating nozzle 30. Subsequently, as illustrated in FIG. 25B, the glass substrate G is moved in the positive direction of the Y-axis while ejecting the coating liquid P1 from the coating nozzle 30, so that the coating liquid P1 is applied to the glass substrate G Then, as illustrated in FIG. 25C, the glass substrate G is moved to the positive direction side of the Y-axis direction of the coating nozzle 30, so that the coating liquid P1 is applied to the entire surface of the glass substrate G.

At this time, the coating liquid P1 is applied while shear stress (block arrow in FIGS. 25B and 25C) is applied. Since the coating nozzle 30 does not move and the glass substrate G moves in the positive direction of the Y-axis direction, the shear stress is applied in the negative direction of the Y-axis direction.

Figure 26A:
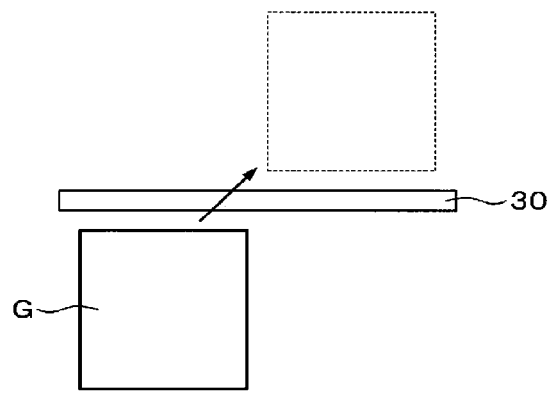
FIGS. 26A to 26C are explanatory views illustrating an operation of the glass substrate and the coating nozzle in step S6 of another embodiment.

Meanwhile, in the step S6, as illustrated in FIG. 26A, the glass substrate G held by the stage 20 is arranged in the negative direction side of the Y-axis direction and also in the negative direction side of the X-axis direction of the coating nozzle 30. Subsequently, as illustrated in FIG. 25B, the glass substrate G is moved in the positive direction of the Y-axis and in the positive direction of the X-axis direction while ejecting the coating liquid Q1 from the coating nozzle 30, so that the coating liquid Q1 is applied to the glass substrate G Then, as illustrated in FIG. 25C, the glass substrate G is moved to the positive direction side of the Y-axis direction and also in the positive direction side of the X-axis direction of the coating nozzle 30, so that the coating liquid Q1 is applied to the entire surface of the glass substrate G.

Figure 26B:
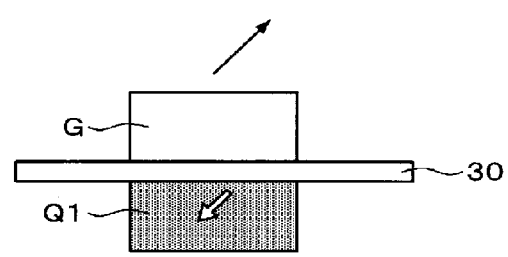
Figure 26C:
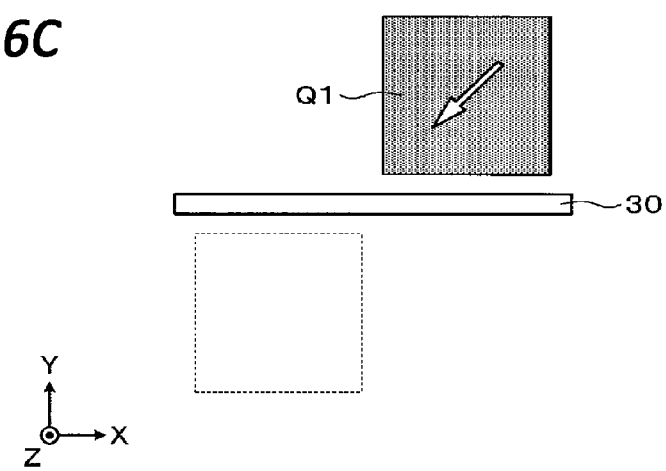

At this time, the coating liquid Q1 is applied while shear stress (block arrow in FIGS. 26B and 26C) is applied. That is, the shear stress is applied in a direction of inclination of 45 degrees in the negative direction of the Y-axis direction and the negative direction of the X-axis direction.

In the present embodiment as well, the same effect as in the above-described embodiment may be obtained. That is, the linear polarizing film P1 and the λ/4 wavelength film Q1 are formed such that polarizing axes thereof cross each other at 45 degrees by crossing the coating direction of the coating liquid P1 in the step S1 and the coating direction of the coating liquid Q1 in the step S6 at 45 degrees.

Although not illustrated, the stage 20 (the glass substrate G) may be fixed, and the coating nozzle 30 may be moved in the horizontal direction (X-axis direction and Y-axis direction). Even in this case, the same effect as in the above-described embodiment may be obtained. However, from a viewpoint of space saving that reduces the occupied area of the apparatus, as illustrated in FIG. 1, the coating processing apparatus 10 that moves the glass substrate G held by the stage 20 in the X-axis direction, and moves the coating nozzle 30 in the Y-axis direction is preferable.

In the above-described embodiment, in a case of producing a circular polarizing plate used in an OLED, a case where a linear polarizing film (linear polarizing plate) and a λ/4 wavelength film (λ/4 wavelength plate) are formed on a glass substrate as optical films has been described as an example, but the present disclosure may be applied to other cases. For example, the present disclosure may be applied to a polarizing plate or a wavelength plate used in an LCD. Further, the wavelength plate is not limited to the λ/4 wavelength film, but the present disclosure may be applied to other wavelength plate, for example, a 212 wavelength film or the like.

Although exemplary embodiments of the present disclosure have been described with reference to the accompanying drawings, the present disclosure is not limited thereto. It should be understood that various modifications or changes that can be easily inferred by those skilled in the art within the scope and spirit described in the claims fall within the scope of the present disclosure.

DESCRIPTION OF SYMBOLS

10: coating processing apparatus
20: stage
21: rail
30: coating nozzle
31: ejecting port
32: moving mechanism
40: collecting unit
50: controller
100: decompressive drying apparatus
200: conveying region
300: heating processing apparatus

400: film fixing apparatus
500: film removing apparatus
G: glass substrate
P1: linear polarizing film (coating liquid)
P2: linear polarizing film
Q1: $\lambda/4$ wavelength film (coating liquid)
Q2: $\lambda/4$ wavelength film

The invention claimed is:

1. A coating processing apparatus comprising:
a substrate holder that holds a substrate;
an elongated nozzle including a slit-shaped ejecting port that ejects a coating liquid containing an optical material to the substrate held by the substrate holder to apply the coating liquid to the substrate; and
a moving mechanism including a substrate mover and a nozzle mover that relatively moves the substrate holder and the elongated nozzle, respectively, in an orthogonal direction; and
a controller that controls the moving mechanism,
wherein the controller is configured to control a coating direction of the coating liquid applied to the substrate by controlling a relative moving speed of the substrate holder and the elongated nozzle,
the controller is configured to control the moving mechanism to move the substrate holder in one direction from a first position to a second position, and, at the same time, move the elongated nozzle in a direction orthogonal to the one direction while the coating liquid is ejected from the elongated nozzle, so as to apply the coating liquid in a direction inclined with respect to the substrate held by the substrate holder, and
wherein the slit-shaped ejecting port extends in the one direction for a distance longer than a moving range of the substrate between the first position and the second position in the one direction.

2. The coating processing apparatus according to claim 1, wherein the moving speed of the elongated nozzle is the same as the moving speed of the substrate held by the substrate holder.

3. The coating processing apparatus according to claim 1, wherein the substrate holder is smaller in size than the substrate in a plan view.

4. The coating processing apparatus according to claim 1, wherein a collector for the coating liquid is provided below the substrate holder and the elongated nozzle.

5. A coating processing apparatus comprising:
a substrate holder that holds a substrate;
an elongated nozzle including a slit-shaped ejecting port that ejects a coating liquid containing an optical material to the substrate held by the substrate holder to apply the coating liquid to the substrate;
a moving mechanism including a substrate mover and a nozzle mover that relatively moves the substrate holder and the elongated nozzle, respectively, in an orthogonal direction; and
a controller that controls the moving mechanism,
wherein the controller is configured to control a coating direction of the coating liquid applied to the substrate by controlling a relative moving speed of the substrate holder and the elongated nozzle,
the elongated nozzle is provided in a state of being fixed,
the controller is configured to control the moving mechanism to move the substrate holder in the one direction, and, at the same time, move the substrate holder in a direction orthogonal to the one direction from a first position to a second position across the elongated nozzle while the coating liquid is ejected from the elongated nozzle, so as to move the substrate in a direction inclined with respect to the one direction and the orthogonal direction thereof to apply the coating liquid in a direction inclined with respect to the substrate held by the substrate holder, and
wherein the slit-shaped ejecting port extends in the one direction for a distance longer than a moving range of the substrate between the first position and the second position in the one direction.

6. The coating processing apparatus according to claim 5, wherein the inclined direction is inclined by 45 degrees with respect to the one direction and the orthogonal direction thereof.

7. A coating processing method comprising:
ejecting a coating liquid containing an optical material from a slit-shaped ejecting port of an elongated nozzle while relatively moving a substrate holder that holds a substrate and the elongated nozzle in an orthogonal direction with respect to each other to apply the coating liquid to the substrate; and
moving the substrate holder in one direction from a first position to a second position, and at the same time, moving the elongated nozzle in a direction orthogonal to the one direction while the coating liquid is ejected from a slit-shaped ejecting port of the elongated nozzle, while controlling a relative moving speed of the substrate holder and the elongated nozzle, so as to apply the coating liquid in a direction inclined with respect to the substrate held by the substrate holder,
wherein the slit-shaped ejecting port extends in the one direction for a distance longer than a moving range of the substrate between the first position and the second position in the one direction.

8. The coating processing method according to claim 7, wherein the elongated nozzle extends in the one direction, the substrate holder is moved in the one direction and, at the same time, the substrate holder is moved in the one direction and the direction orthogonal to the one direction, thereby a second coating liquid is applied to the substrate held by the substrate holder in the inclined direction with respect to the substrate held by the substrate holder.

9. The coating processing method according to claim 7, wherein the elongated nozzle is provided in a state of extending in the one direction and being fixed, and
the substrate holder is moved in the one direction, and, at the same time, the substrate holder is moved in the one direction and the direction orthogonal to the one direction across the elongated nozzle, so as to apply a second coating liquid to the substrate held by the substrate holder in the inclined direction with respect to the substrate held by the substrate holder.

10. The coating processing method according to claim 7, wherein the inclined direction is a direction that is inclined by 45 degrees with respect to the one direction and the orthogonal direction thereof.

11. The coating processing method according to claim 7, wherein the coating liquid that is not applied to the substrate from among the coating liquid ejected from the elongated nozzle is collected by a collector provided below the substrate holder and the elongated nozzle.

12. A non-transitory computer-readable storage medium having stored therein a computer executable program that causes a computer to perform the coating processing method of claim 7.

* * * * *